United States Patent
Kaczman et al.

(10) Patent No.: US 8,610,503 B2
(45) Date of Patent: Dec. 17, 2013

(54) APPARATUS AND METHODS FOR OSCILLATION SUPPRESSION

(75) Inventors: Daniel Lee Kaczman, Newbury Park, CA (US); Haibo Cao, Pasadena, CA (US); Russ Alan Reisner, Newbury Park, CA (US); Nai-Shuo Cheng, Thousand Oaks, CA (US); James Phillip Young, Thousand Oaks, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 30 days.

(21) Appl. No.: 13/328,896

(22) Filed: Dec. 16, 2011

(65) Prior Publication Data

US 2012/0154054 A1    Jun. 21, 2012

Related U.S. Application Data

(60) Provisional application No. 61/424,561, filed on Dec. 17, 2010.

(51) Int. Cl.
  *H03F 3/68*    (2006.01)
(52) U.S. Cl.
  USPC ...................................... 330/295; 330/124 R
(58) Field of Classification Search
  USPC ................................ 330/295, 124 R, 84, 126
  See application file for complete search history.

(56) References Cited

U.S. PATENT DOCUMENTS

| | | | |
|---|---|---|---|
| 5,264,752 A | 11/1993 | Savicki | |
| 7,321,263 B2 | 1/2008 | Brabetz et al. | |
| 7,382,186 B2 * | 6/2008 | Apel et al. | 330/129 |
| 7,482,869 B2 | 1/2009 | Wilson | |
| 7,489,914 B2 | 2/2009 | Govind et al. | |
| 7,915,959 B2 * | 3/2011 | Shibata | 330/295 |
| 8,130,043 B2 * | 3/2012 | Arell | 330/302 |
| 2002/0030543 A1 | 3/2002 | French et al. | |

(Continued)

FOREIGN PATENT DOCUMENTS

| | | |
|---|---|---|
| GB | 2398648 | 8/2004 |
| GB | 2409115 | 11/2006 |

(Continued)

OTHER PUBLICATIONS

Search Report and Written Opinion of Aug. 24, 2012 for International Application No. PCT/US2011/065650, 15 pages.

(Continued)

*Primary Examiner* — Henry Choe
(74) *Attorney, Agent, or Firm* — Knobbe Martens Olson & Bear LLP

(57) ABSTRACT

Apparatus and methods for oscillation suppression are disclosed. In one embodiment, a power amplifier system includes a plurality of power amplifiers for amplifying an input radio frequency (RF) signal to generate an output RF signal. The plurality of power amplifiers include a first power amplifier, a second power amplifier, and a third power amplifier, each of which are configured to be individually switchable between an enabled state and a disabled state so as to control a power amplification of the power amplifier system. A first capacitor is electrically connected between the outputs of the first and second power amplifiers, and a second capacitor is electrically connected between the outputs of the second and third power amplifiers. The first and second capacitors are configured to allow signals generated using the first, second, and third power amplifiers to combine constructively to generate the output RF signal.

20 Claims, 9 Drawing Sheets

(56) References Cited

U.S. PATENT DOCUMENTS

| | | |
|---|---|---|
| 2003/0155978 A1 | 8/2003 | Pehlke |
| 2005/0156671 A1 | 7/2005 | Shanjani et al. |
| 2006/0044067 A1* | 3/2006 | Suzaki et al. .............. 330/295 |
| 2007/0210771 A1 | 9/2007 | Wilson et al. |
| 2007/0249304 A1 | 10/2007 | Snelgrove et al. |
| 2007/0273449 A1 | 11/2007 | Wilson |
| 2007/0279019 A1 | 12/2007 | Wilson |
| 2008/0036541 A1* | 2/2008 | Thompson .................. 330/295 |
| 2009/0128236 A1 | 5/2009 | Wilson |
| 2009/0289720 A1 | 11/2009 | Takinami et al. |
| 2009/0302941 A1 | 12/2009 | Wimpenny |
| 2010/0156531 A1 | 6/2010 | Hirata |
| 2012/0146731 A1* | 6/2012 | Khesbak .................... 330/295 |

FOREIGN PATENT DOCUMENTS

| | | |
|---|---|---|
| GB | 2426392 | 5/2007 |
| GB | 2411062 | 11/2007 |
| WO | WO 2009/106628 | 9/2009 |
| WO | WO 2009/106631 | 9/2009 |
| WO | WO 2009/106632 | 9/2009 |
| WO | WO 2009/127739 | 10/2009 |
| WO | WO 2009/135941 | 11/2009 |
| WO | WO 2009/138505 | 11/2009 |
| WO | WO 2009/141413 | 11/2009 |

OTHER PUBLICATIONS

Blanken et al. "A 50MHz Bandwidth Multi-Mode PA Supply Modulator for GSM, EDGE and UMTS Application," IEEE Radio Frequency Integrated Circuits Symposium, Apr. 2008, pp. 401-404.

Huang et al. "A MASH Controlled Multilevel Power Converter for High-Efficiency RF Transmitters," IEEE Transactions on Power Electronics, vol. 26, No. 4, Apr. 2011, pp. 1205-1214.

Kaneta et al. "Architecture of Wideband High-Efficiency Envelope Tracking Power Amplifier for Base Station," IEICE Technical Report, Osaka, 2009.

Kang et al. "A Multimode/Multiband Power Amplifier With a Boosted Supply Modulator," IEEE Transactions on Microwave Theory and Techniques, vol. 58, No. 10, Oct. 2010, pp. 2598-2608.

Rodriguez et al. "A Multiple-Input Digitally Controlled Buck Converter for Envelope Tracking Applications in Radiofrequency Power Amplifiers," IEEE Transactions on Power Electronics, vol. 25, No. 2, Feb. 2010, pp. 369-381.

Wu et al. "A Two-Phase Switching Hybrid Supply Modulator for Polar Transmitters with 9% Efficiency Improvement," IEEE International Solid-State Circuits Conference, Feb. 2010, pp. 196-198.

Yousefzadeh et al. "Three-Level Buck Converter for Envelope Tracking Applications," IEEE Transactions on Power Electronics, vol. 21, No. 2, Mar. 2006, pp. 549-552.

\* cited by examiner

APPARATUS AND METHODS FOR OSCILLATION SUPPRESSION

CROSS-REFERENCE TO RELATED APPLICATIONS

This application claims the benefit of priority under 35 U.S.C. §119(e) of U.S. Provisional Patent Application No. 61/424,561, filed Dec. 17, 2010 entitled "APPARATUS AND METHOD FOR OSCILLATION SUPPRESSION", which is herein incorporated by reference in its entirety.

BACKGROUND

1. Field

Embodiments of the invention relate to radio frequency (RF) electronic systems, and in particular, to power amplifier systems.

2. Description of the Related Technology

Power amplifiers can be included in mobile devices to amplify a RF signal for transmission via an antenna. For example, in mobile devices having a time division multiple access (TDMA) architecture, such as those found in Global System for Mobile Communications (GSM), code division multiple access (CDMA), and wideband code division multiple access (W-CDMA) systems, a power amplifier can be used to amplify a RF signal having a relatively low power. It can be important to manage the amplification of a RF signal, as a desired transmit power level can depend on how far the user is away from a base station and/or the mobile environment. Power amplifiers can also be employed to aid in regulating the power level of the RF signal over time, so as to prevent signal interference from transmission during an assigned receive time slot.

When a power amplifier is configured to amplify a RF signal having a signal envelope that changes with time, such as a CDMA, W-CDMA or Long Term Evolution (LTE) signal, a usage profile of a mobile phone by a user can follow a probability density function in which it is more likely that the power amplifier will be operated below a maximum power level. The usage profile can vary with carrier system design as well as with operating conditions, such as a rural or urban operating environment. Since conventional power amplifiers suffer from reduced efficiency and linearity at low power levels, there is a need for improved power amplifier topologies. Furthermore, to prolong battery life of a mobile device, it can also be desirable to achieve a relative low quiescent current when the phone is in an idle condition.

To aid in improving the operation of the power amplifier system, including, for example, increased efficiency, improved linearity, and/or a reduced quiescent current, a power amplifier system can include multiple power amplifiers. However, a power amplifier system including multiple power amplifiers can be prone to instability for a variety of reasons, including, for example, the presence of feedback paths associated with the power amplifiers. Power amplifier instability can degrade system performance, and can lead to dropped calls and/or spurious emissions failures.

There is a need for improved power amplifier systems.

SUMMARY

In certain embodiments, the present disclosure relates to a power amplifier system including a plurality of power amplifiers for amplifying an input radio frequency (RF) signal to generate an output RF signal, the plurality of power amplifiers including a first power amplifier, a second power amplifier, and a third power amplifier. The first, second, and third power amplifiers are each configured to be individually switchable between an enabled state and a disabled state so as to control a power amplification of the power amplifier system. The power amplifier system further includes a first capacitor electrically connected between an output of the first power amplifier and an output of the second power amplifier and a second capacitor electrically connected between the output of the second power amplifier and an output of the third power amplifier. The first and second capacitors are configured to allow signals generated using the first, second, and third power amplifiers to combine constructively to generate the output RF signal.

In various embodiments, a power amplification of the third power amplifier is greater than a power amplification of the second power amplifier, and the power amplification of the second power amplifier is greater than a power amplification of the first power amplifier.

In some embodiments, the power amplifier system further includes a first inductor configured to bias the first power amplifier with a supply voltage, a second inductor configured to bias the second power amplifier with the supply voltage, and a third inductor configured to bias the third power amplifier with the supply voltage.

In a number of embodiments, the second capacitor and the second inductor are configured to provide an impedance transformation such that a load line impedance at the output of second power amplifier is greater than a load line impedance at the output of the third power amplifier. In various embodiments, the first capacitor and the first inductor are configured to provide an impedance transformation such that a load line impedance at the output of first power amplifier is greater than the load line impedance at the output of the second power amplifier.

In accordance with several embodiments, the power amplifier system further includes a third capacitor electrically connected in parallel with the first inductor, the third capacitor and the first inductor configured to operate as a first resonant circuit to suppress an oscillation of the first power amplifier at a sub-harmonic of a fundamental frequency of the output RF signal.

In certain embodiments, the power amplifier system further includes a harmonic termination block electrically connected to the output of the third power amplifier. In several embodiments, the harmonic termination block includes a harmonic termination inductor and a harmonic termination capacitor electrically connected in series and configured to provide a low impedance path at about twice the fundamental frequency of the output RF signal.

In some embodiments, the power amplifier system further includes an impedance matching block electrically connected to the output of the third power amplifier.

According to a number of embodiments, the power amplifier system further includes a phase shifter for delaying the input RF signal to the first and second power amplifiers so as to align signals generated using the first, second, and third power amplifiers so that they combine in phase to generate the output RF signal.

In various embodiments, the first, second, and third power amplifiers each include an input stage and an output stage, the input stages and the output stages electrically powered using different power supplies.

According to several embodiments, the first power amplifier includes a first bipolar transistor for amplifying the input RF signal, the second power amplifier includes a second bipolar transistor for amplifying the input RF signal, and the third power amplifier includes a third bipolar transistor for amplifying the input RF signal.

In some embodiments, the power amplifier system further includes a limiting circuit electrically connected to the collector of the first bipolar transistor, the limiting circuit configured to inhibit a voltage change on the collector of the first bipolar transistor so as to prevent operation of the base and collector of the first bipolar transistor as a pumped varactor.

In certain embodiments the power amplifier system further includes a resistor in series with the base of the third bipolar transistor, the resistor having a resistance selected to inhibit operation of the base and collector of the third bipolar transistor as a pumped varactor.

In some embodiments, the first power amplifier is enabled and the second and third power amplifiers are disabled in a first power setting, the first and second power amplifiers are enabled and the third power amplifier is disabled in a second power setting, and the first, second and third power amplifiers are each enabled in a third power setting.

In certain embodiments, the present disclosure relates to a method of amplifying an input RF signal to generate an output RF signal. The method includes generating a first amplified signal by amplifying the input RF signal using a first power amplifier and generating a second amplified signal by amplifying the input RF signal using a second power amplifier. The second power amplifier includes an output electrically connected to an output of the first power amplifier using a first capacitor. The method further includes generating a third amplified signal by amplifying the input RF signal using a third power amplifier. The third power amplifier includes an output electrically connected to the output of the second power amplifier using a second capacitor. The method further includes combining the first, second and third amplified signals using the first and second capacitors to generate the output RF signal.

In several embodiments, a power amplification of the third power amplifier is greater than a power amplification of the second power amplifier, and the power amplification of the second power amplifier is greater than a power amplification of the first power amplifier.

According to a number of embodiments, the method further includes biasing the first power amplifier with a supply voltage using a first inductor, biasing the second power amplifier with the supply voltage using a second inductor, and biasing the third power amplifier with the supply voltage using a third inductor.

In some embodiments, the method further includes using the second inductor and the second capacitor to transform a load line of impedance of the second power amplifier to be greater than a load line impedance of the third power amplifier. In several embodiments, the method further includes using the first inductor and the first capacitor to transform a load line of impedance of the first power amplifier to be greater than the load line impedance of the second power amplifier.

According to certain embodiments, the method further includes suppressing an oscillation of the first power amplifier at a sub-harmonic of a fundamental frequency of the output RF signal using a first resonant circuit, the first resonant including a third capacitor electrically connected in parallel with the first inductor.

In some embodiments, the method further includes delaying the input RF signal to the first and second power amplifiers using a phase shifter so as to align the first, second and third amplified signals so that they combine in phase.

In accordance with several embodiments, the method further includes using a first bipolar transistor to generate the first amplified signal, using a second bipolar transistor to generate the second amplified signal, and using a third bipolar transistor to generate the third amplified signal.

In several embodiments, the method further includes inhibiting a voltage change on the collector of the first bipolar transistor using a limiting circuit so as to prevent operation of the base and collector of the first bipolar transistor as a pumped varactor.

In certain embodiments, the method further includes providing a resistor in series with the base of the third bipolar transistor, the resistor having a resistance selected to inhibit operation of the base and collector of the third bipolar transistor as a pumped varactor.

In certain embodiments, the present disclosure relates to a power amplifier system including a first bipolar transistor for operating as a first power amplifier, the first bipolar transistor having a base for receiving a radio frequency signal of a first frequency and a collector for amplifying the radio frequency signal. The power amplifier system further includes a first resonant circuit electrically connected to the collector of the first bipolar transistor, the first resonant circuit having a first inductor electrically connected in parallel with a first capacitor, the first resonant circuit configured to suppress an oscillation of the first power amplifier at a sub-harmonic of the first frequency.

In various embodiments, the power amplifier system further includes a second bipolar transistor for operating as a second power amplifier.

In some embodiments, the power amplifier system further includes a second capacitor having a first end electrically connected to the collector of the first bipolar transistor and a second end electrically connected to a collector of the second bipolar transistor.

In a number of embodiments, the second capacitor and the first inductor transform an impedance at the collector of the first bipolar transistor so as to provide a termination impedance for the first bipolar transistor that improves at least one of efficiency, linearity and quiescent current of the first bipolar transistor.

In some embodiments, the second bipolar transistor has a power amplification that is greater than a power amplification of the first bipolar transistor. According to a number of embodiments, the first and second power amplifiers are enabled in a first power mode of the power amplifier system, and the first power amplifier is enabled and the second power amplifier is disabled in a second power mode of the system.

In accordance with several embodiments, the power amplifier system further includes a harmonic termination circuit electrically connected to the collector of the second bipolar transistor, the harmonic termination circuit including a second inductor electrically connected in series with a third capacitor, the harmonic termination circuit configured to suppress an oscillation of the first power amplifier at a harmonic of the first frequency.

In certain embodiments, the power amplifier system further includes a third bipolar transistor for operating as a third power amplifier, the third bipolar transistor having a base for receiving the radio frequency signal and a collector for amplifying the radio frequency signal. According to several embodiments, the power amplifier system further includes a third capacitor having a first end electrically connected to the collector of the second bipolar transistor and a second end electrically connected to the collector of the third bipolar transistor.

In various embodiments, the first resonant circuit is electrically connected between the collector of the first bipolar transistor and a collector of the second bipolar transistor.

In a number of embodiments, the power amplifier system further includes a resistor in series with the base of the first bipolar transistor, the resistor having a resistance selected to inhibit operation of the base and collector of the first bipolar transistor as a pumped varactor when the first and second bipolar transistors amplify the radio frequency signal.

In several embodiments, the power amplifier system further includes a dampening circuit electrically connected to the collector of the first bipolar transistor, the dampening circuit configured to improve stability of the first power amplifier by limiting a signal swing of the collector of the first bipolar transistor.

In certain embodiments, the present disclosure relates to a power amplifier system including a first bipolar transistor for operating as a first power amplifier, the first bipolar transistor having a base for receiving a radio frequency signal and a collector for amplifying the radio frequency signal. The power amplifier system further includes a second bipolar transistor for operating as a second power amplifier, the second bipolar transistor having a base for receiving the radio frequency signal and a collector for amplifying the radio frequency signal. The power amplifier system further includes a first resistor in series with the base of the first bipolar transistor, the first resistor having a resistance selected to inhibit operation of the base and collector of the first bipolar transistor as a pumped varactor when the first and second bipolar transistors amplify the input signal.

In various embodiments, the first resistor has a resistance selected to cancel a negative input resistance of the base of the first bipolar transistor when the first and second bipolar transistors receive the input signal.

In a number of embodiments, the second bipolar transistor has a power amplification that is greater than a power amplification of the first bipolar transistor.

In accordance with several embodiments, the power amplifier system includes a first enable signal for enabling the first power amplifier and a second enable signal for enabling the second power amplifier. In certain embodiments, the first enable signal and the second enable signal are activated in a first power mode of the power amplifier system, and the first enable signal is activated and second enable signal is deactivated in a second power mode of the system so as to improve at least one of efficiency, linearity and quiescent current of the power amplifier system.

In certain embodiments, the present disclosure relates to a power amplifier system including a first bipolar transistor for operating as a first power amplifier, the first bipolar transistor having a base for receiving a radio frequency signal and a collector for amplifying the radio frequency signal. The power amplifier system further includes a second bipolar transistor for operating as a second power amplifier, the second bipolar transistor having a base for receiving the radio frequency signal and a collector for amplifying the radio frequency signal. The power amplifier system further includes a limiting circuit electrically connected to the collector of the first bipolar transistor, the limiting circuit configured to inhibit a voltage change on the collector of the first bipolar transistor so as to prevent operation of the base and collector of the first bipolar transistor as a pumped varactor when the first and second bipolar transistors amplify the input signal.

In various embodiments, the power amplifier system further includes a capacitor having a first end electrically connected to the collector of the first bipolar transistor and a second end electrically connected to the collector of the second bipolar transistor.

In some embodiments, the second bipolar transistor has a power amplification that is greater than a power amplification of the first bipolar transistor.

In a number of embodiments, the power amplifier system includes a first enable signal for enabling the first power amplifier and a second enable signal for enabling the second power amplifier.

In accordance with several embodiments, the first enable signal and the second enable signal are activated in a first power mode of the power amplifier system, and the first enable signal is activated and second enable signal is deactivated in a second power mode of the system.

In several embodiments, the limiter circuit includes at least one reverse-biased diode.

DETAILED DESCRIPTION OF EMBODIMENTS

The headings provided herein, if any, are for convenience only and do not necessarily affect the scope or meaning of the claimed invention.

Overview of Power Amplifier Systems

Figure 1:
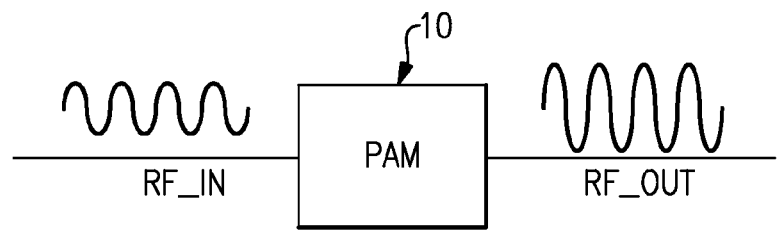
FIG. 1 is a schematic diagram of a power amplifier module for amplifying a radio frequency (RF) signal.

FIG. 1 is a schematic diagram of a power amplifier module 10 for amplifying a radio frequency (RF) signal. The illustrated power amplifier module 10 can be configured to amplify an RF signal RF_IN to generate an amplified RF signal RF_OUT. As described herein, the power amplifier module 10 can include one or more power amplifiers.

Figure 2:
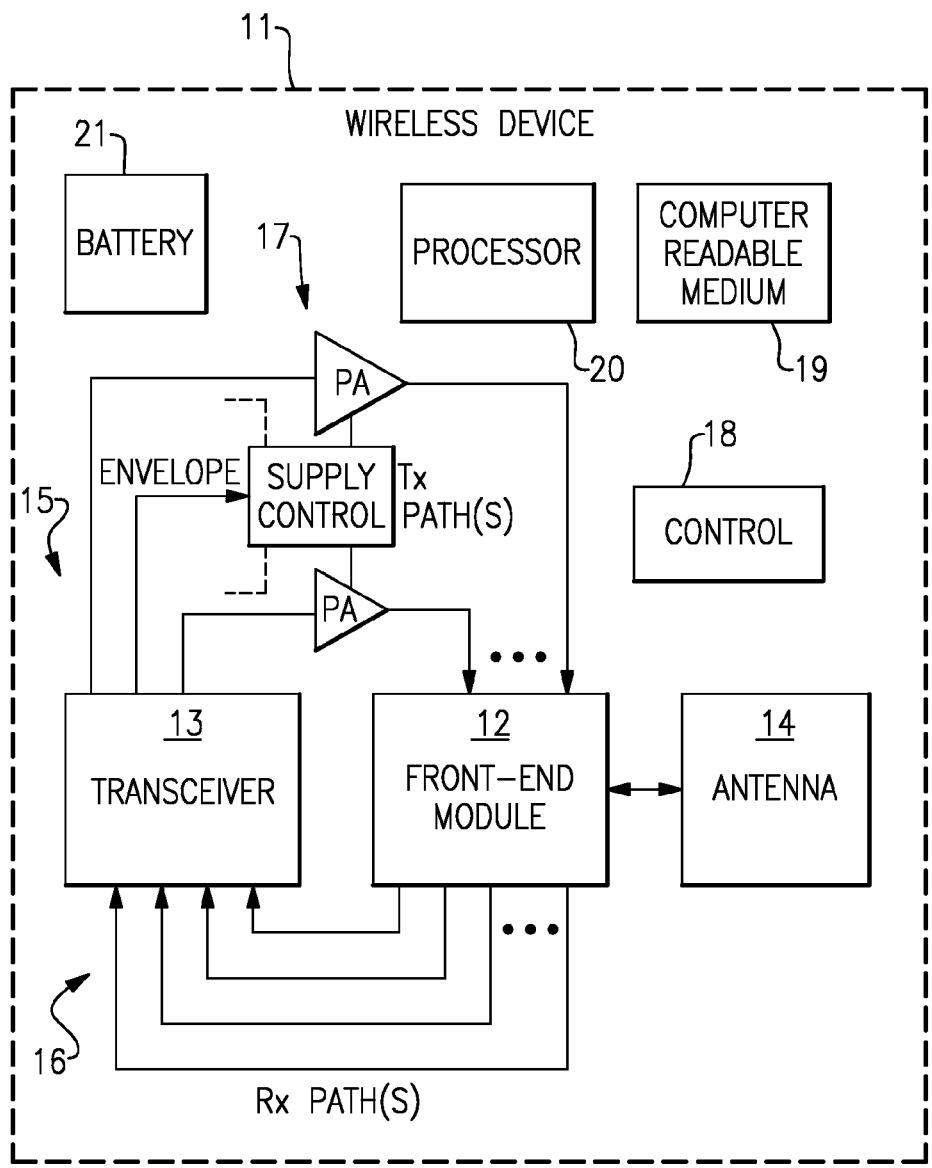
FIG. 2 is a schematic block diagram of an example wireless device that can include one or more of the power amplifier modules of FIG. 1.

FIG. 2 is a schematic block diagram of an example wireless device 11 that can include one or more of the power amplifier modules 10 of FIG. 1. The wireless device 11 can also implement one or more features of the present disclosure.

The example wireless or mobile device 11 depicted in FIG. 2 can represent a multi-band and/or multi-mode device such as a multi-band/multi-mode mobile phone. By way of examples, Global System for Mobile (GSM) communication standard is a mode of digital cellular communication that is utilized in many parts of the world. GSM mode mobile phones can operate at one or more of four frequency bands: 850 MHz (approximately 824-849 MHz for Tx, 869-894

MHz for Rx), 900 MHz (approximately 880-915 MHz for Tx, 925-960 MHz for Rx), 1800 MHz (approximately 1710-1785 MHz for Tx, 1805-1880 MHz for Rx), and 1900 MHz (approximately 1850-1910 MHz for Tx, 1930-1990 MHz for Rx). Variations and/or regional/national implementations of the GSM bands are also utilized in different parts of the world.

Code division multiple access (CDMA) is another standard that can be implemented in mobile phone devices. In certain implementations, CDMA devices can operate in one or more of 800 MHz, 900 MHz, 1800 MHz and 1900 MHz bands, while certain W-CDMA and Long Term Evolution (LTE) devices can operate over, for example, about 22 radio frequency spectrum bands.

One or more features of the present disclosure can be implemented in the foregoing example modes and/or bands, and in other communication standards. For example, 3G, 4G, LTE and Advanced LTE are non-limiting examples of such standards.

In certain embodiments, the wireless device 11 can include a front-end module 12, a transceiver 13, an antenna 14, power amplifiers 17, a control component 18, a computer readable medium 19, a processor 20, a battery 21, and a power control or supply control block 22.

The transceiver 13 can generate RF signals for transmission via the antenna 14. Furthermore, the transceiver 13 can receive incoming RF signals from the antenna 14.

It will be understood that various functionalities associated with the transmission and receiving of RF signals can be achieved by one or more components that are collectively represented in FIG. 2 as the transceiver 13. For example, a single component can be configured to provide both transmitting and receiving functionalities. In another example, transmitting and receiving functionalities can be provided by separate components.

Similarly, it will be understood that various antenna functionalities associated with the transmission and receiving of RF signals can be achieved by one or more components that are collectively represented in FIG. 2 as the antenna 14. For example, a single antenna can be configured to provide both transmitting and receiving functionalities. In another example, transmitting and receiving functionalities can be provided by separate antennas. In yet another example, different bands associated with the wireless device 11 can be provided with different antennas.

In FIG. 2, one or more output signals from the transceiver 13 are depicted as being provided to the antenna 14 via one or more transmission paths 15. In the example shown, different transmission paths 15 can represent output paths associated with different bands and/or different power outputs. For instance, the two example power amplifiers 17 shown can represent amplifications associated with different power output configurations (e.g., low power output and high power output), and/or amplifications associated with different bands. Although FIG. 2 illustrates the wireless device 11 as including two transmission paths 15, the wireless device 11 can be adapted to include more or fewer transmission paths 15.

In FIG. 2, one or more detected signals from the antenna 14 are depicted as being provided to the transceiver 13 via one or more receiving paths 16. In the example shown, different receiving paths 16 can represent paths associated with different bands. For example, the four example receiving paths 16 shown can represent quad-band capability that some wireless devices are provided with. Although FIG. 2 illustrates the wireless device 11 as including four receiving paths 16, the wireless device 11 can be adapted to include more or fewer receiving paths 16.

To facilitate switching between receive and transmit paths, the front-end module 12 can be configured to electrically connect the antenna 14 to a selected transmit or receive path. Thus, the front-end module 12 can provide a number of switching functionalities associated with operation of the wireless device 11. In certain embodiments, the front-end module 12 can include a number of switches configured to provide functionalities associated with, for example, switching between different bands, switching between different power modes, switching between transmission and receiving modes, or some combination thereof. The front-end module 12 can also be configured to provide additional functionality, including filtering and/or duplexing of signals.

FIG. 2 shows that in certain embodiments, a control component 18 can be provided for controlling various control functionalities associated with operations of the front-end module 12, the power amplifiers 17, the supply control block 22, and/or other operating components.

In certain embodiments, a processor 20 can be configured to facilitate implementation of various processes described herein. For the purpose of description, embodiments of the present disclosure may also be described with reference to flowchart illustrations and/or block diagrams of methods, apparatus (systems) and computer program products. It will be understood that each block of the flowchart illustrations and/or block diagrams, and combinations of blocks in the flowchart illustrations and/or block diagrams, may be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the acts specified in the flowchart and/or block diagram block or blocks.

In certain embodiments, these computer program instructions may also be stored in a computer-readable memory 19 that can direct a computer or other programmable data processing apparatus to operate in a particular manner, such that the instructions stored in the computer-readable memory produce an article of manufacture including instruction means which implement the acts specified in the flowchart and/or block diagram block or blocks. The computer program instructions may also be loaded onto a computer or other programmable data processing apparatus to cause a series of operations to be performed on the computer or other programmable apparatus to produce a computer implemented process such that the instructions that execute on the computer or other programmable apparatus provide steps for implementing the acts specified in the flowchart and/or block diagram block or blocks.

The illustrated wireless device 11 also includes the supply control block 22, which can be used to provide a power supply voltage to one or more of the power amplifiers 17. For example, the supply control block 22 can include an envelope tracker configured to vary the supply voltage provided to the power amplifiers 17 based upon an envelope of the RF signal to be amplified. However, in certain embodiments the supply control block 22 can include other components.

The supply control block 22 can be electrically connected to the battery 21, and the supply control block 22 can be configured to generate the supply voltage for the power amplifiers 17. The battery 21 can be any suitable battery for use in the wireless device 11, including, for example, a lithium-ion battery. As will be described in detail further below, by varying the voltage provided to the power amplifiers, the power consumed from the battery 21 can be reduced, thereby improving the battery life of the wireless device 11. In certain implementations, the supply control block 22 can control the power amplifier supply voltage based on an envelope of the RF signal to be amplified. The envelope signal can be provided to the supply control block 22 from the transceiver 13. However, the envelope can be determined in other ways. For example, the envelope can be determined by detecting the envelope of the RF signal using any suitable envelope detector.

Figure 3:
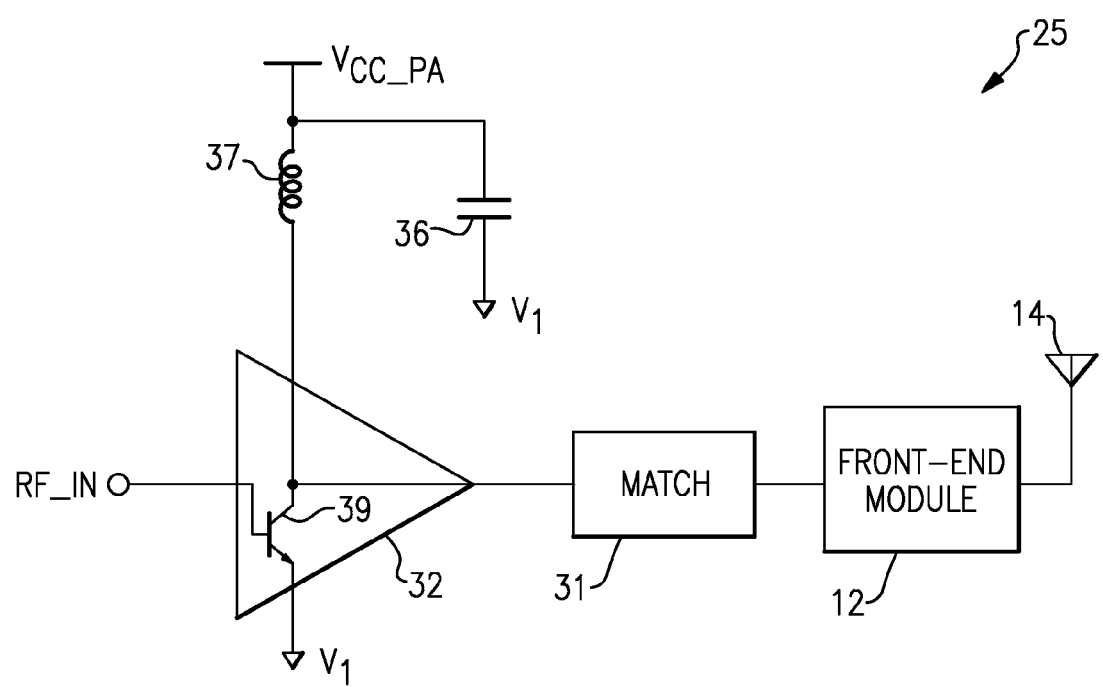
FIG. 3 is a schematic diagram of one example of a power amplifier system.

FIG. 3 is a schematic diagram of one example of a power amplifier system 25. The illustrated power amplifier system 25 includes the front-end module 12, the antenna 14, an impedance matching block 31, a power amplifier 32, a decoupling or bypass capacitor 36, and an inductor 37.

The illustrated power amplifier 32 includes a bipolar transistor 39 having an emitter, a base, and a collector. The emitter of the bipolar transistor 39 can be electrically connected to a first supply voltage $V_1$, which can be, for example, a ground node. A radio frequency (RF) signal RF_IN can be provided to the base of the bipolar transistor 39. The bipolar transistor 39 can amplify the RF signal RF_IN and provide the amplified RF signal at the collector. The bipolar transistor 39 can be any suitable device. In one implementation, the bipolar transistor 39 is a heterojunction bipolar transistor (HBT).

Although FIG. 3 illustrates one example of a power amplifier suitable for use with the teachings herein, the teachings herein can be applied to a variety of power amplifier structures, such as multi-stage power amplifier structures and power amplifiers employing other transistor structures. For example, in some implementations the bipolar transistor 39 can be omitted in favor of employing a field-effect transistor (FET), such as a silicon FET, a gallium arsenide (GaAs) high electron mobility transistor (HEMT), or a laterally diffused metal oxide semiconductor (LDMOS) transistor.

The power amplifier 32 can be configured to provide the amplified RF signal to the front-end module 12. The impedance matching block 31 can be used to aid in terminating the electrical connection between the power amplifier 32 and the front-end module 12. For example, the impedance matching block 31 can be used to increase power transfer and/or reduce reflections of the amplified RF signal generated using the power amplifier 32.

The inductor 37 can be used to provide the power amplifier supply voltage $V_{CC\_PA}$ to the power amplifier 32 while choking or blocking high frequency RF signal components. The inductor 37 can include a first end electrically connected to the power amplifier supply voltage $V_{CC\_PA}$, and a second end electrically connected to the collector of the bipolar transistor 39. The power amplifier supply voltage $V_{CC\_PA}$ can be any suitable supply voltage, such as a supply voltage from a battery or a supply voltage from a supply control module, such as a DC-to-DC converter and/or an envelope tracker. As shown in FIG. 3, in certain implementations a supply input of the power amplifier 32 used to receive a power supply can be electrically connected to an output of the power amplifier 32.

The decoupling capacitor 36 includes a first end electrically connected to the first end of the inductor 37 and a second end electrically coupled to the first supply voltage $V_1$. The decoupling capacitor 36 can provide a low impedance path to high frequency signals, thereby reducing the noise of the power amplifier supply voltage $V_{CC\_PA}$, improving power amplifier stability, and/or improving the performance of the inductor 37 as a RF choke.

Figure 4A:
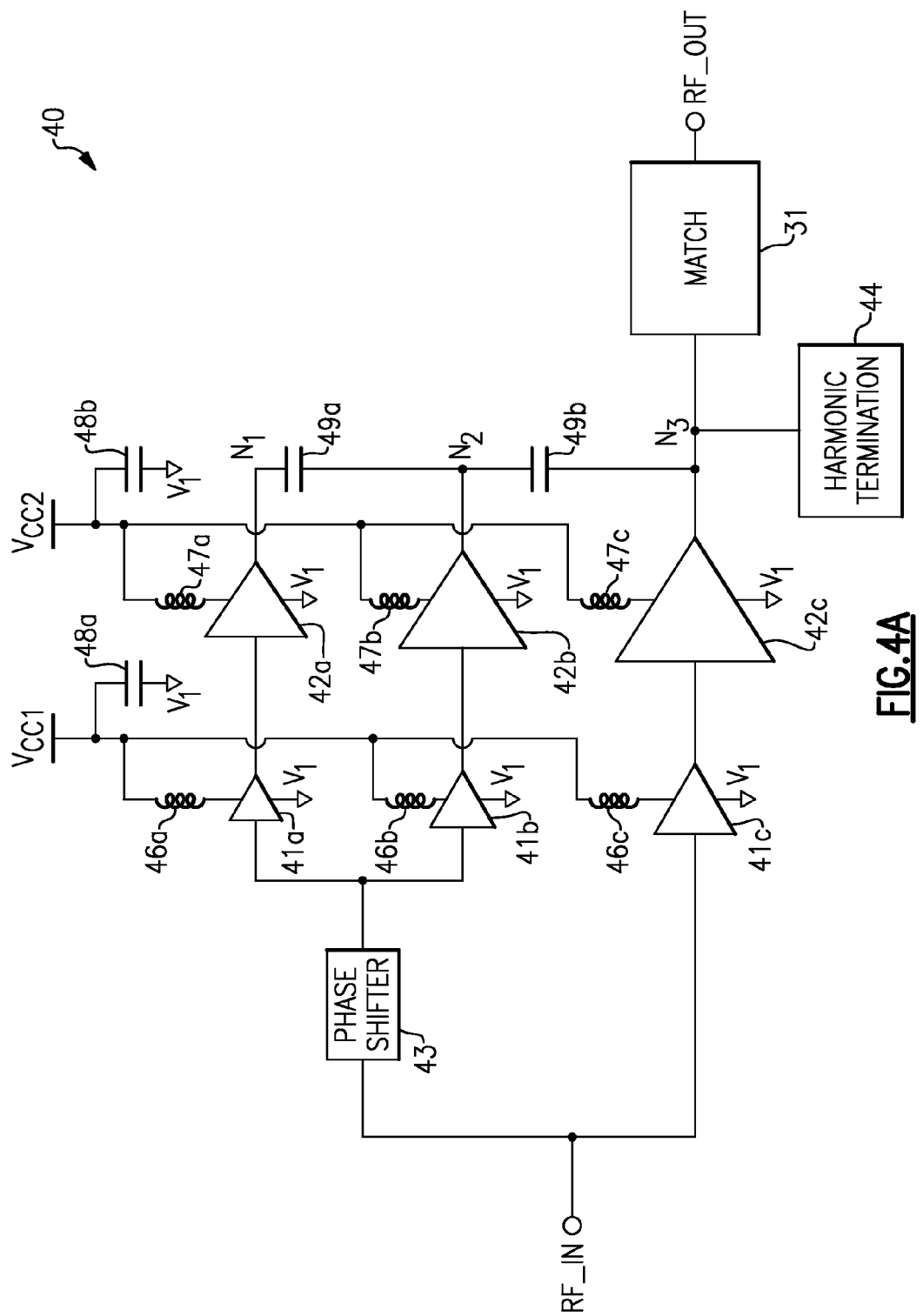
FIG. 4A is a schematic diagram of one embodiment of a power amplifier system.

FIG. 4A is a schematic diagram of one embodiment of a power amplifier system 40. The power amplifier system 40 includes an impedance matching block 31, first to third input stages 41a-41c, first to third output stages 42a-42c, a phase shifter 43, a harmonic termination block 44, first to third input stage inductors 46a-46c, first to third output stage inductors 47a-47c, a first decoupling capacitor 48a, a second decoupling capacitor 48b, a first impedance transformation capacitor 49a, and a second impedance transformation capacitor 49b.

The phase shifter 43 includes an input configured to receive a RF signal RF_IN and an output electrically connected to an input of each of the first and second input stages 41a, 41b. The first output stage 42a includes an input electrically connected to an output of the first input stage 41a and an output electrically connected to a first node $N_1$. Additionally, the second output stage 42b includes an input electrically connected to an output of the second input stage 41b and an output electrically connected to a second node $N_2$. Furthermore, the third input stage 41c includes an input configured to receive the RF signal RF_IN. Additionally, the third output stage 42c includes an input electrically connected to an output of the third input stage 41c and an output electrically connected to a third node $N_3$.

The impedance matching block 31 includes a first end electrically connected to the third node $N_3$ and a second end configured to provide an amplified output signal RF_OUT. The impedance matching block 31 can be used to increase power transfer and/or to reduce reflections of signals generated using one or more of the first to third power amplifier stages 42a-42c when an antenna or other load is electrically connected to the second end of the impedance matching block 31. Additional details of the impedance matching block 31 can be similar to those described earlier with respect to FIG. 3.

The harmonic termination block 44 is electrically connected to the third node $N_3$ and can be used to provide a low impedance path at one or more harmonic frequencies of the RF signals amplified by the first to third output stages 42a-42c. For example, in certain implementations the harmonic termination block 44 can be a second harmonic termination circuit configured to provide a low impedance path to the first power supply voltage $V_1$ at about twice the operational or fundamental frequency of the amplified output signal RF_OUT. Including the harmonic termination block 44 in the power amplifier system 40 can improve the performance of the power amplifier system 40 by enhancing stability and/or by increasing the signal-to-noise ratio of the amplified output signal RF_OUT.

Although the impedance matching block 31 and the harmonic termination block 44 have been illustrated separately in FIG. 4A, persons having ordinary skill in the art will appreciate that each of these blocks can be collectivity tuned so as to achieve a desired impedance versus frequency characteristic for the third output stage 42c. For example, in a configuration in which a bipolar transistor is used for providing power amplification in the third output stage 42c, the impedance matching block 31, the harmonic termination block 44, and the third inductor 37c can be tuned to achieve a desired impedance at the collector of the bipolar transistor, including a desired impedance at a fundamental frequency and/or one or more harmonic frequencies.

The first to third input stages 41a-41c and the first to third output stages 42a-42c have been configured to operate as a plurality of multi-stage power amplifiers. For example, the first input stage 41a and the first output stage 42a have been configured to operate as a first or small power amplifier, the second input stage 41b and the second output stage 42b have been configured to operate as a second or medium power amplifier, and the third input stage 41c and the third output stage 42c have been configured to operate as a third or large power amplifier. In certain implementations, the medium power amplifier can have a power amplification that is greater than a power amplification of the small power amplifier, and the large power amplifier can have a power amplification that is greater than the power amplification of each of the small and medium power amplifiers.

As illustrated, the first to third output stages 42a-42c are electrically connected in parallel using the first and second impedance transformation capacitors 49a, 49b, and can each be used to generate the amplified output signal RF_OUT of the power amplifier system 40 in all or part. The output of the second output stage 42b is electrically connected to the output of the third output stage 42c through the second impedance transformation capacitor 49b, and the output of the first output stage 42a is electrically connected to the output of the second output stage 42b through the first impedance transformation capacitor 49a.

Using the first and second impedance transformation capacitors 49a, 49b can aid in combining signals generated using the first to third output stags 42a-42c at the third node $N_3$, while helping to provide a desired load line or termination impedance for each of the first to third output stages 42a-42c. Additional details of the first and second impedance transformation capacitors 49a, 49b will be described below with reference to FIG. 4B.

In one embodiment, one or more of the first to third output stages 42a-42c can be selectively enabled to aid in providing a desired output signal power level. For example, the first output stage 42a can be enabled while the second and third output stages 42b, 42c are disabled to provide a low power setting for the power amplifier system 40. The low power setting can aid in reducing quiescent current, improving efficiency, and/or improving linearity of the power amplifier system 40, which can be important when the power amplifier system 40 operates frequently below a maximum power level, such as in certain CDMA, W-CDMA and LTE configurations. Additionally, the first and second output stages 42a, 42b can be enabled while the third output stage 42c is disabled to provide a medium power setting for the power amplifier system 40, which can also be used to reduce quiescent current and improve efficiency and/or linearity when operating at a power level below a maximum. Furthermore, the first to third output stages 42a-42c can each be enabled to provide a high power setting. Although one implementation of power settings has been described, other configurations can be used.

The power amplifier system 40 can provide numerous advantages relative to conventional power amplifier system designs. For example, the illustrated power amplifier system 40 can be used to combine signals generated using the first to third output stages 42a-42c, including providing adequate phase such that the signals generated from each output stage add constructively. Furthermore, the illustrated power amplifier system 40 can provide a relatively low phase discontinuity between different power modes or levels.

In certain implementations, the phase shifter 43 is used to delay the RF signal RF_IN provided to the first and second input stages 41a, 41b to help align the outputs of the first to third output stages 42a-42c so that they combine in-phase to generate the amplified RF signal RF_OUT. However, in some implementations, the phase shifter 43 can be omitted and/or arranged in other configurations to provide phase shifting. Additionally, in some implementations multiple phase shifters can be employed. For example, the inputs of the first and second input stages 41a, 41b can each include a separate phase shifter.

The first to third input stages 41a-41c and the first to third output stages 42a-42c have been electrically powered using different power supplies. For example, the first to third input stage inductors 46a-46c have been used to provide a first power amplifier supply voltage $V_{CC1}$ to the first to third input stages 41a-41c, respectively, and the first to third output stage inductors 47a-47c have been used to provide a second power amplifier supply voltage $V_{CC2}$ to the first to third output stages 42a-42c, respectively. Using different power supplies to provide power to the input stages 41a-41c and to the output stages 42a-42c can enhance the stability of the power amplifier system 40. For example, using separate supplies can isolate the first to third input stages 41a-41c from noise and/or signals associated with the first to third output stages 42a-42c. However, other configurations are possible, such as implementations in which the input stages 41a-41c and the output stages 42a-42c are electrically powered using the same power supply.

The illustrated power amplifier system 40 includes the first and second bypass capacitors 48a, 48b, which can be used to provide RF grounding for the first and second power amplifier supply voltages $V_{CC1}$, $V_{CC2}$, respectively. The first bypass capacitor 48a includes a first end electrically connected to the first power amplifier supply voltage $V_{CC1}$ and a second end electrically connected to the first power supply voltage $V_1$. The second bypass capacitor 48b includes a first end electrically connected to the second power amplifier supply voltage $V_{CC2}$ and a second end electrically connected to the first power supply voltage $V_1$. In certain implementations, the first power supply voltage $V_1$ is a ground node. However, other configurations are possible, such as configurations in which the first power supply voltage $V_1$ is a negative or low voltage supply. Additional details of the first and second bypass capacitors 48a, 48b can be similar to those described above with respect to the bypass capacitor 36 of FIG. 3.

Although FIG. 4A illustrates the power amplifier system 40 as employing three power amplifiers to generate the amplified RF signal RF_OUT, the power amplifier system 40 can be modified to include more or fewer power amplifiers. Additionally, although certain oscillation suppression schemes will be described herein in the context of the power amplifier system 40, the oscillation suppression schemes can be applicable to other power amplifier systems.

Figure 4B:
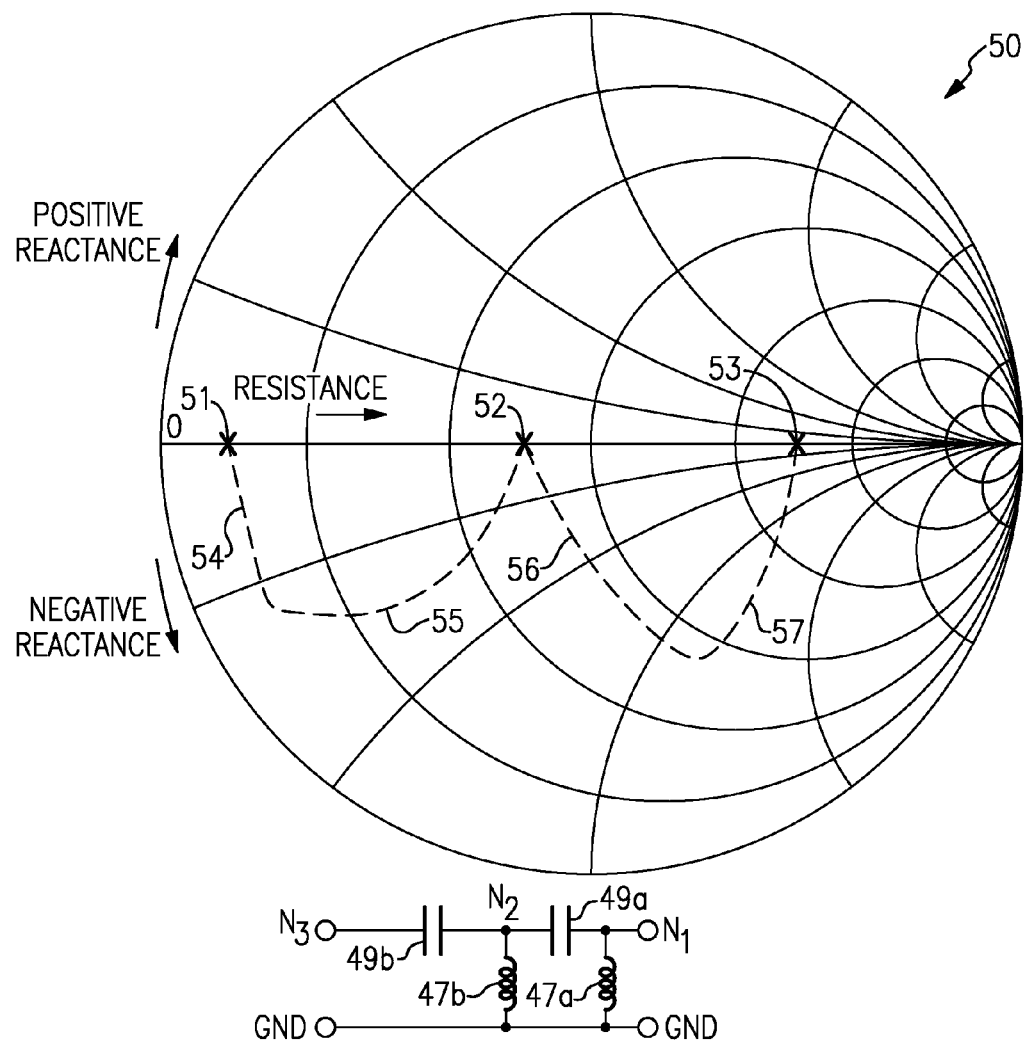
FIG. 4B is one example of a Smith chart for the power amplifier system of FIG. 4A.

FIG. 4B is one example of a Smith chart 50 for the power amplifier system 40 of FIG. 4A. The Smith chart 50 has also been annotated to include a portion of the power amplifier system 40 of FIG. 4A, including the first and second impedance transformation capacitors 47a, 47b, the first and second output stage inductors 49a, 49b, the first to third nodes $N_1$ to $N_3$, and RF ground GND.

The Smith chart 50 provides a graphical illustration of the load line impedance of the first to third output stages 42a-42c of the power amplifier system 40 of FIG. 50. For example, a first impedance point 51 can indicate a load line impedance of the third output stage 42c, a second impedance point 52 can indicate a load line impedance of the second output stage 42b, and a third impedance point 53 can indicate a load line impedance of the third output stage 42c. As will be described below, the power amplifier system 40 has been configured to provide different load line impedances for each of the first to third output stages 42a-42c so as to improve the efficiency and/or linearity of the power amplifier system relative to a configuration using the same load line impedance for each output stage.

Power amplifiers can have an optimal load line impedance that can depend on a size or power amplification of the power amplifier. For example, a relatively large power amplifier can have an optimal load line impedance that is less than that of a relatively small power amplifier. As was described above with reference to FIG. 4A, the third output stage 42c can have a power amplification greater than that of the second output stage 42b, and the second output stage 42b can have a power amplification greater than that of the first output stage 42a. Accordingly, it can be desirable from a power efficiency and/or linearity standpoint for the load line impedance of the third output stage 42c to be less than the load line impedance of the second output stage 42b, and for the load line impedance of the second output stage 42b to be less than the load line impedance of the first output stage 42a.

In certain implementations, the impedance matching block 31, the harmonic termination block 44, and the third output stage inductor 47c can be tuned to achieve a desired load line impedance at the output of the third output stage 42c. Since the third output stage 42c can be relatively large, the resulting load line impedance of the third output stage 42c can be relatively small.

To transform the load line impedance at the output of the third output stage 42c to a load line impedance at the output of the second output stage 42b that is closer to or equal to an ideal value, the second impedance transformation capacitor 49b and the second output stage inductor 47b have been configured to provide an impedance transformation. For example, the second impedance transformation capacitor 49b can operate to provide a first impedance transformation 54 and the second output stage inductor 47b can operate provide a second impedance transformation 55 so as to shift the load line impedance from the first impedance point 51 to the second impedance point 52. Shifting the load line impedance in this manner can help provide different load line impedances to the second and third output stages 42b, 42c, thereby improving the power efficiency of the power amplifier system 40 relative to a design in which the a single load line impedance is employed for both output stages.

The first impedance transformation capacitor 49a and the first output stage inductor 47a can also be configured to provide an impedance transformation that can shift a load line impedance at the output of the second output stage 42b to a load line impedance at the output of the first output stage 42a that is closer to or equal to an ideal value. For example, the first impedance transformation capacitor 49a can operate to provide a third impedance transformation 56 and the first output stage inductor 47a can operate provide a fourth impedance transformation 57 so as to shift the load line impedance from the second impedance point 52 to the third impedance point 53.

By using the first and second impedance transformation capacitors 49a, 49b, different load line impedances can be provided at the outputs of each of the first to third output stages 42a-42c. Accordingly, the efficiency of the power amplifier system 40 can be improved by providing load line impedances for each output stage that have improved power efficiency. Accordingly, using the first and second impedance transformation capacitors 49a, 49b can improve performance of the power amplifier system 40 relative to a design in which the outputs of the first to third output stages 42a-42c are connected to the same node and have the same load line impedance.

Overview of Power Amplifier Configurations for Suppressing Oscillations

A transistor used to provide amplification in a power amplifier can exhibit oscillatory behavior. For example, in a bipolar transistor configuration, the base-collector junction of the bipolar transistor can operate as a varactor. Under certain conditions, the RF signal received by the power amplifier can pump the varactor, thereby leading to power amplifier instability. For example, a power amplifier can be configured to amplify a signal centered at a fundamental or operational frequency of about $f_o$, and the base-collector junction of the bipolar transistor can operate as a pumped varactor under large signal conditions, which can lead to sub-harmonic oscillations at a frequency of about $f_o/2$.

Sub-harmonic oscillations can also be exacerbated in systems with relatively small bypass capacitors. For example, a system employing envelope tracking can have relatively small bypass capacitors, since bypass capacitors can load the envelope tracker. However, omitting or reducing the magnitude of bypass capacitors can render the power amplifier system unstable over all or a portion of the range of operation of the power amplifier system. For example, a power amplifier system may need to operate under a varying voltage standing wave ratio (VSWR), such as a VSWR that can vary by a factor of six or more times. Removal or reduction of the bypass capacitors can result in the power amplifier system exhibiting undesirable oscillations or instability when the VSWR is varied.

Power amplifier stability can also be a concern in systems having a multiple power amplifiers electrically connected to a common power supply. For example, electrically connecting the power supply nodes of a plurality of power amplifiers together in a multimode power amplifier or parallel power amplifier system can increase the number of feedback paths, thereby endangering system stability. Sub-harmonic oscillations in these multi power amplifier systems can be exacerbated by a need to operate under varying VSWR.

Figure 5A:
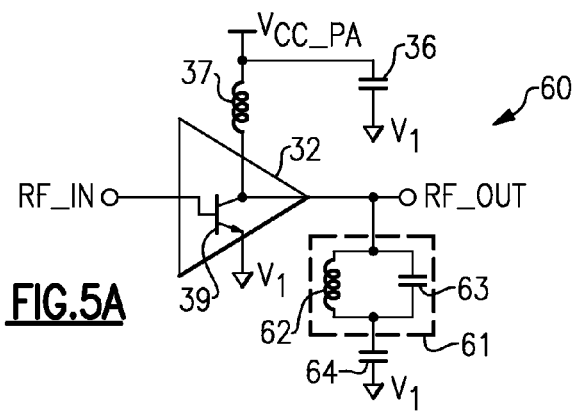
FIGS. 5A-5C illustrate schematic diagrams of various embodiments of power amplifier systems.
Figure 5B:
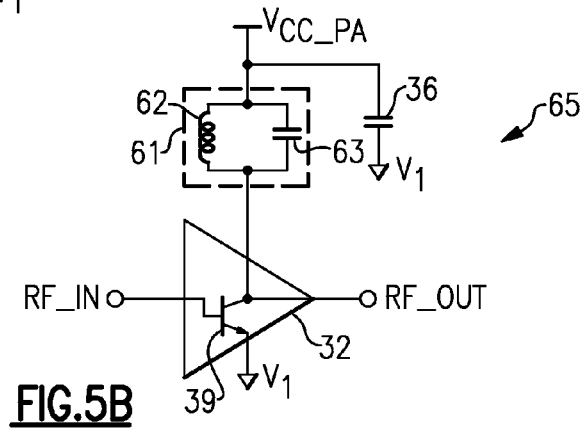
Figure 5C:
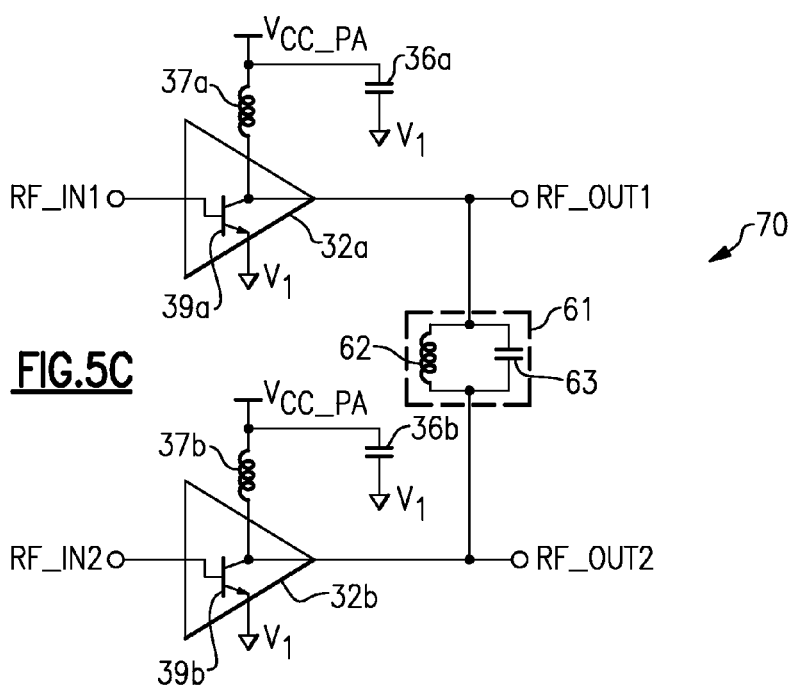

FIGS. 5A-5C illustrate schematic diagrams of various embodiments of power amplifier systems.

FIG. 5A is a schematic diagram of a power amplifier system 60 according to one embodiment. The power amplifier system 60 includes the power amplifier 32, the bypass capacitor 36, the choke inductor 37, a parallel inductor-capacitor (LC) resonant circuit 61, and a capacitor 64.

The power amplifier 32 includes a bipolar transistor 39 having an emitter, a base, and a collector. The emitter of the bipolar transistor 39 is electrically connected to a first supply voltage $V_1$, which can be, for example, a ground node. A RF signal RF_IN can be provided to the base of the bipolar transistor 39. The bipolar transistor 39 can amplify the RF signal RF_IN and provide the amplified RF signal RF_OUT at the collector.

The inductor 37 has been electrically connected between the power amplifier supply voltage $V_{CC\_PA}$ and the collector of the bipolar transistor 39, and can be used to provide the power amplifier supply voltage $V_{CC\_PA}$ to the power amplifier 32 while choking or blocking high frequency signals. The bypass capacitor 36 is electrically connected between the power amplifier supply voltage $V_{CC\_PA}$ and the first supply voltage $V_1$, and can operate as a low impedance path to high frequency signals, as was described earlier.

The parallel LC resonant circuit 61 includes a first end electrically connected to the collector of the bipolar transistor 39 and a second end electrically connected to a first end of the capacitor 64. The capacitor 64 includes a second end electrically connected to the first supply voltage $V_1$, and can be used to provide a RF ground to the second end of the parallel LC resonant circuit 61.

The parallel LC resonant circuit 61 includes an inductor 62 and a capacitor 63 electrically connected in parallel, and can be used to suppress sub-harmonic oscillations of the power amplifier 32. For example, the parallel LC resonant circuit 61 can be configured to have a resonance near the operational frequency $f_o$ of the power amplifier 32 and a relatively low impedance near $f_o/2$ and/or $2*f_o$. Configuring the parallel LC resonant circuit 61 in this manner can aid in providing a relatively high impedance to the amplified signal RF_OUT while suppressing oscillations, such as oscillations at half the operational frequency of the power amplifier 32. The parallel LC resonant circuit 61 can suppress out of band signals at higher-order harmonics, such as harmonics located at $2*f_o$ and/or $3*f_o$, by providing a low-impedance termination to one or more of these harmonics.

In one embodiment, the parallel LC resonant circuit 61 is configured to resonate within about 100 MHz of the operating frequency of the power amplifier 32. Since the resonant frequency of the parallel LC resonant circuit 61 can vary inversely to the square root of product of the inductance of the inductor 62 and the capacitance of the capacitor 63, the inductor 62 and the capacitor 63 can be sized relative to one another to achieve the desired resonant frequency.

FIG. 5B is a schematic diagram of a power amplifier system 65 according to another embodiment. The power amplifier system 65 includes the power amplifier 32, the bypass capacitor 36, and the parallel LC resonant circuit 61.

The power amplifier 32 includes a bipolar transistor 39, and can be used to amplify a RF signal RF_IN to generate an amplified RF signal RF_OUT as was described above. The parallel LC resonant circuit 61 includes a first end electrically connected to the power amplifier supply voltage $V_{CC\_PA}$ and a second end electrically connected to the collector of the bipolar transistor 39. The parallel LC resonant circuit 61 includes an inductor 62 and a capacitor 63 electrically connected in parallel, and can be used to suppress sub-harmonic oscillations of the power amplifier 32 by providing a low impedance path to the power amplifier supply voltage $V_{CC\_PA}$ for signals near $f_o/2$ and/or $2*f_o$, which can aid in suppressing oscillations at the collector of the bipolar transistor 39. Additional details of the parallel LC resonant circuit 61 can be similar to those described earlier.

As described above with reference to FIG. 5A, in certain embodiments the parallel LC resonant circuit 61 has a resonance centered at about $f_o$. However, in other embodiments, such as in the power amplifier system 65 illustrated in FIG. 5B, the parallel LC resonant circuit 61 has been combined with another inductor and/or capacitor and thus can resonate at a frequency offset from the fundamental frequency. For example, in contrast to the power amplifier system 60 of FIG. 5A which includes the choke inductor 37, the power amplifier system 65 of FIG. 5B illustrates a configuration in which the choke inductor 37 has been combined into the parallel LC resonant circuit 61 to aid in reducing the size and/or number of circuit components in the power amplifier system 65.

By combining a component such as a choke inductor with the parallel LC resonant circuit 61, an electrically equivalent circuit can formed that is implemented using smaller component sizes and/or number. Since the parallel LC resonant circuit 61 can be configured present an impedance similar to that of a choke inductor 37 for signals near the operating frequency, the parallel LC resonant circuit 61 can have a resonance offset from the operating frequency, such as a resonant frequency offset from the fundamental frequency by 400 MHz or more. However, the parallel LC resonant circuit 61 can still suppress out of band signals at higher-order harmonics, such as harmonics located at $2*f_o$ and/or $3*f_o$, by providing a low-impedance termination to one or more of these harmonics.

The power amplifier system 65 further includes the bypass capacitor 36, which can be used to provide a low impedance path to high frequency signals, thereby reducing the noise of the power amplifier supply voltage $V_{CC\_PA}$ and improving performance of the power amplifier system 65. Additional details of the bypass capacitor 36 can be as described earlier.

FIG. 5C is a schematic diagram of a power amplifier system 70 according to yet another embodiment. The power amplifier system 70 includes a first power amplifier 32a, a second power amplifier 32b, a first inductor 37a, a second inductor 37b, a first bypass capacitor 36a, a second bypass capacitor 36b, and the parallel LC resonant circuit 61.

The first power amplifier 32a includes a first bipolar transistor 39a, and can be used to amplify a first RF signal RF_IN1 to generate a first amplified RF signal RF_OUT1 in a manner similar to that described earlier. Additionally, the second power amplifier 32b includes a second bipolar transistor 39b, and can be used to amplify a second RF signal RF_IN2 to generate a second amplified RF signal RF_OUT2. The first and second inductors 37a, 37b have been electrically connected between the power amplifier supply voltage $V_{CC\_PA}$ and the collectors of the first and second bipolar transistors 39a, 39b, respectively, and can be used to provide the power amplifier supply voltage $V_{CC\_PA}$ to the first and second power amplifiers 32a, 32b. The first and second bypass capacitor 36a, 36b are each electrically connected between the power amplifier supply voltage $V_{CC\_PA}$ and the first supply voltage $V_1$, and can provide decoupling capacitance to the first and second power amplifiers 32a, 32b, respectively.

The parallel LC resonant circuit 61 includes a first end electrically connected to the collector of the first bipolar transistor 39a and a second end electrically connected to the collector of the second bipolar transistor 39b. In certain implementations, the parallel LC resonant circuit 61 is provided across the outputs of two power amplifier stages, such as between two power amplifier output stages, between two power amplifier input stages, and/or between a power amplifier output stage and a power amplifier input stage. Providing power amplifiers in such configurations can aid in suppressing output oscillations.

Figure 6:
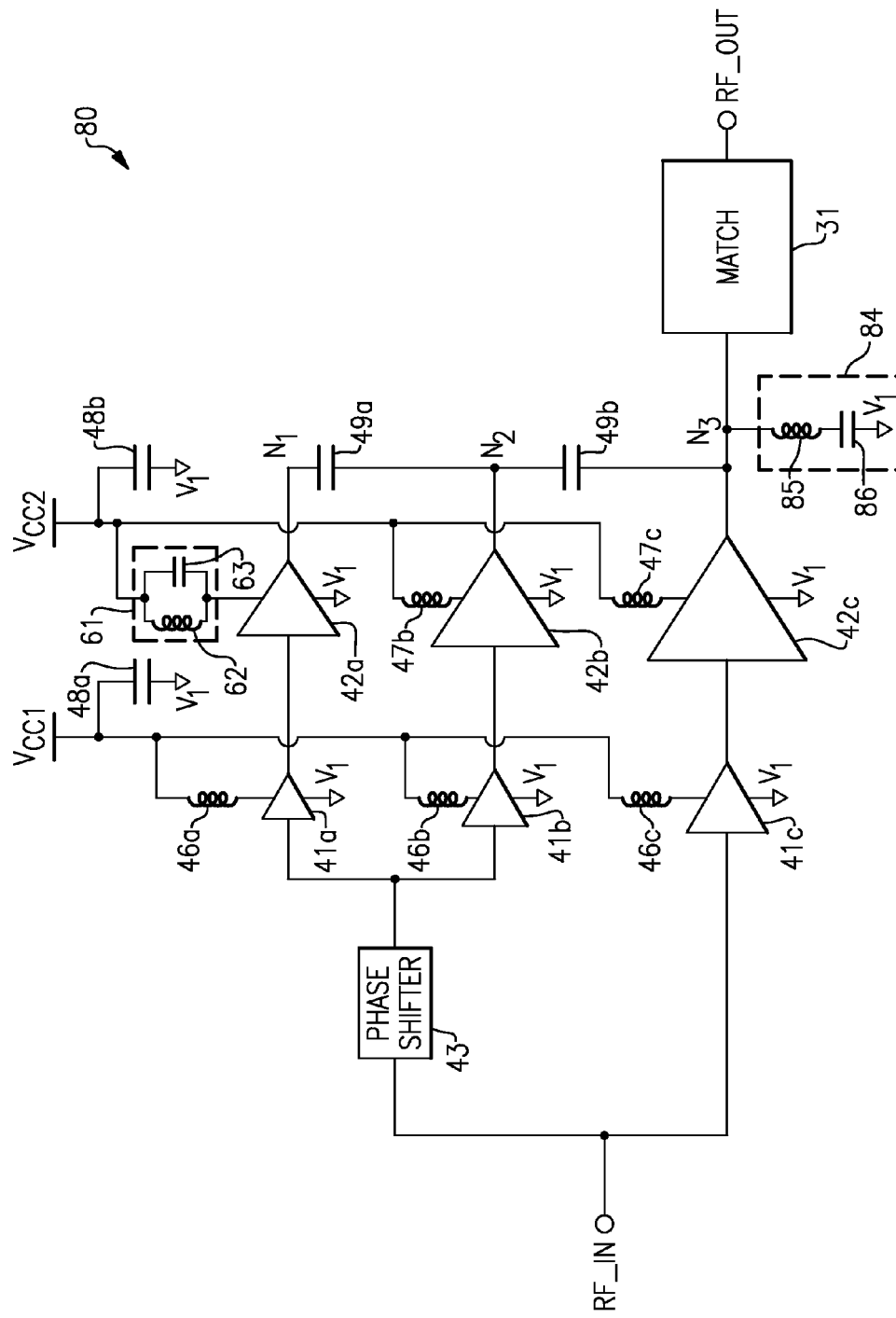
FIG. 6 is a schematic diagram of a power amplifier system according to yet another embodiment.

FIG. 6 is a schematic diagram of a power amplifier system 80 according to yet another embodiment. The power amplifier system 80 includes the impedance matching block 31, the first to third input stages 41a-41c, the first to third output stages 42a-42c, the phase shifter 43, the first to third input stage inductors 46a-46c, the second output stage inductor 47b, the third output stage inductor 47c, the first decoupling capacitor 48a, the second decoupling capacitor 48b, the first impedance transformation capacitor 49a, the second impedance transformation capacitor 49b, the parallel LC resonant circuit 61, and a harmonic termination block 84.

The power amplifier system 80 of FIG. 6 can be similar to the power amplifier system 40 of FIG. 4A. However, in contrast to the power amplifier system 40 of FIG. 4A which includes the first output stage inductor 46a electrically connected between the second power amplifier supply voltage $V_{CC2}$ and a supply input of the first output stage 42a, the power amplifier system 80 includes the parallel LC resonant circuit 61 electrically connected between second power amplifier supply voltage $V_{CC2}$ and the supply input of the first output stage 42a. Additionally, FIG. 6 illustrates an implementation in which the harmonic termination circuit 84 includes an inductor 85 and a capacitor 86 electrically connected in series between the third node $N_3$ and the first power supply $V_1$.

The harmonic termination circuit 84 can be configured to have relatively low impedance at a harmonic of the fundamental frequency of the amplified RF output signal RF_OUT, and can aid in preventing and/or reducing oscillations. In certain implementations, the harmonic termination circuit 84 is a second harmonic termination circuit configured to resonate at about twice the fundamental frequency of the amplified RF output signal RF_OUT.

The parallel LC resonant circuit 61 can aid in reducing sub-harmonic oscillations of the power amplifier system 80. For example, when operating the power amplifier system 80 in a power mode in which the third output stage 42c is in an off or disabled state, the third output stage 42c can operate as a feedback path that can reduce stability of the power amplifier system 80. Inclusion of the parallel LC resonant circuit 61 at the output of the first output stage 42a can improve stability by blocking signals having frequencies at sub-harmonics and/or harmonics of the operating frequency. In the configuration illustrated in FIG. 6, the parallel LC resonant circuit 61 can be configured present an impedance similar to that of the first output inductor 47a of FIG. 4A for signals near the operating frequency, and thus the parallel LC resonant circuit 61 can have a resonance offset from the operating frequency.

In FIG. 6, the parallel LC resonant circuit 61 has been provided at the output of the first output stage 42a, which can be configured to have a smaller power amplification than each of the second and third output stages 42b, 42c. However, other configurations are possible. For example, in certain embodiments, one or more additional parallel LC resonant circuits can be included for the second and/or third output stages 42b, 42c. In other embodiments, the parallel LC resonant circuit 61 is omitted for the first output stage 42a in favor of providing a parallel LC resonant circuit for the second and/or third output stages 42b, 42c.

A harmonic termination circuit that includes a series combination of an inductor and a capacitor to provide a low-impedance to a higher-order harmonic of the input frequency can have a greater impact on the load line impedance of a power amplifier as compared to a parallel LC resonant circuit configured to provide a low-impedance at a sub-harmonic and/or a higher-order harmonic of the operating frequency. Since a relatively large power amplifier may need a load line impedance less than that of a relatively small power amplifier, in certain embodiments, the second harmonic termination circuit 84 is provided at the output of the third output stage 42c and the parallel LC resonant circuit 61 is provided at the output of the first output stage 42a. By arranging the circuits in this manner, stability can be improved while maintaining desired load line impedances for the first to third output stages 42a-42c.

Figure 7:
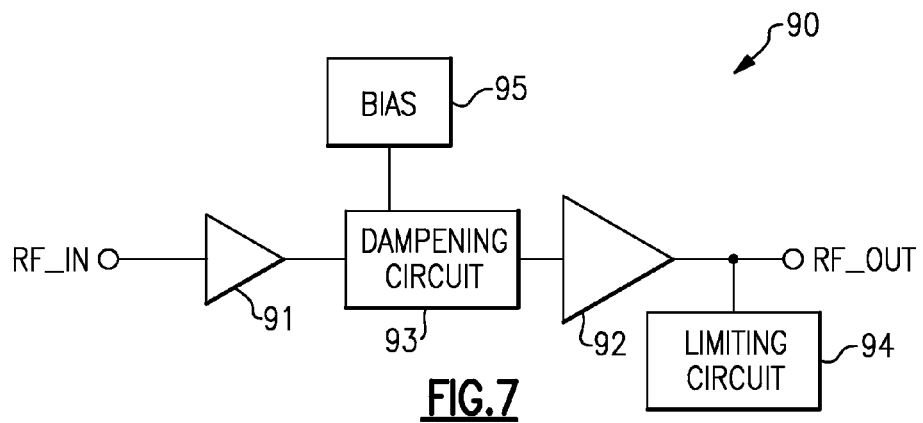
FIG. 7 is a schematic diagram of a power amplifier system according to yet another embodiment.

FIG. 7 is a schematic diagram of a power amplifier system 90 according to yet another embodiment. The power amplifier system 90 includes an input stage 91, an output stage 92, a dampening circuit 93, a limiting circuit 94, and a bias circuit 95.

The input stage 91 includes an input configured to receive a RF input signal RF_IN and an output electrically connected to an input of the output stage 92 through a dampening circuit 93. The output stage 92 further includes an output configured to generate an amplified RF signal RF_OUT. The input of the output stage 92 is configured to receive a bias signal from a bias circuit 95, and the output of the output stage 92 is electrically connected to the limiting circuit 94.

The bias circuit 95 can be used to control the operating point of the output stage 92. For example, in a bipolar transistor configuration, the bias circuit 95 can be used to establish the collector current and/or base-emitter voltage of a bipolar transistor of the output stage 92. Accordingly, the bias circuit 95 can affect the operation and performance of the power amplifier system 90, including the linearity and/or power efficiency of the system.

The dampening circuit 93 has been disposed at the input of the output stage 92, and can be used suppress oscillations. For example, under large signal conditions, the output stage 92 can exhibit a negative input resistance, which can cause oscillations in the power amplifier system 90. The dampening circuit 93 can be used to dampen these oscillations by providing a resistance to cancel the negative input resistance of the output stage 92, thereby stabilizing the power amplifier system 90.

The power amplifier system 90 further includes the limiter circuit 94, which can be used to reduce a rate of change of voltage or dV/dt at the output of the output stage 92. Reducing voltage change at the output of the output stage 92 can limit large signal swings of the power amplifier system 90, thereby improving stability.

Although the power amplifier system 90 illustrates a configuration using both the dampening circuit 93 and the limiting circuit 94 to suppress oscillations, in certain implementations the dampening circuit 93 is included and the limiting circuit 94 is omitted, while in other implementations the dampening circuit 93 is omitted and the limiting circuit 94 is included. Additionally, in some implementations the dampening circuit 93 and/or the limiting circuit 94 is used with other oscillation schemes described herein, such as with the parallel LC resonant circuits of FIGS. 5A-5C.

Figure 8:
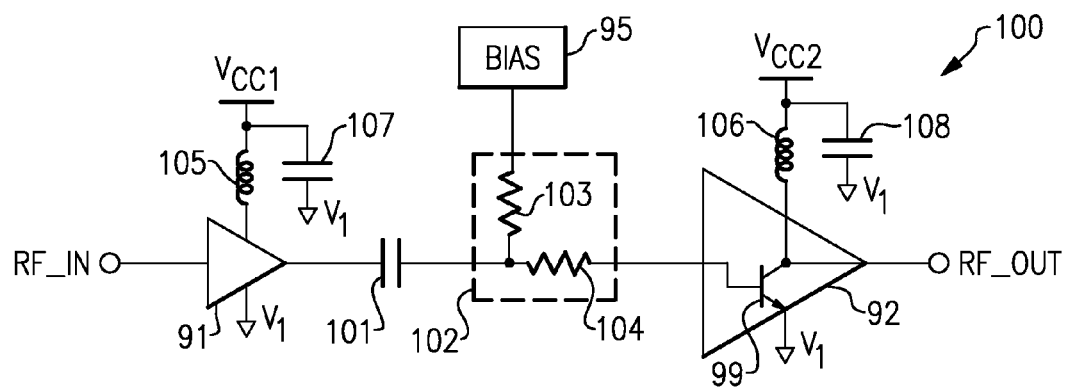
FIG. 8 is a schematic diagram of a power amplifier system according to yet another embodiment.

FIG. 8 is a schematic diagram of a power amplifier system 100 according to yet another embodiment. The power amplifier system 100 includes the input stage 91, the output stage 92, the bias circuit 95, a biasing capacitor 101, a dampening circuit 102, an input stage inductor 105, an output stage inductor 106, an input stage bypass capacitor 107, and an output stage bypass capacitor 108. The output stage 92 includes a bipolar transistor 99, and the dampening circuit 102 includes a first resistor 103 and a second resistor 103.

The input stage 91 includes an input configured to receive a RF input signal RF_IN, and an output electrically connected to a first end of the biasing capacitor 101. The biasing capacitor 101 further includes a second end electrically connected to a first end of the first resistor 103 and to a first end of the second resistor 104. The first resistor 103 further includes a second end electrically connected to the bias circuit 95. The second resistor 104 further includes a second end electrically connected to a base of the bipolar transistor 99. The bipolar transistor 99 further includes an emitter electrically connected to the first supply voltage $V_1$, and a collector configured to generate an amplified RF signal RF_OUT.

The input and output stage inductors 105, 106 can be used to provide first and second power amplifier supply voltages $V_{CC1}$, $V_{CC2}$ to the input and output stages 91, 92, respectively. For example, the input stage inductor 105 is electrically connected between the first power amplifier supply voltage $V_{CC1}$ and a supply input of the input stage 91, and the output stage inductor 106 is electrically connected between the second power amplifier supply voltage $V_{CC2}$ and the collector of the bipolar transistor 92. The input and output stage bypass capacitors 107, 108 are electrically connected between a first supply voltage $V_1$ and the first and second power amplifier supply voltages $V_{CC1}$, $V_{CC2}$, respectively. Although FIG. 8 shows the input and output stages 91, 92 as being powered using different supplies, other configurations are possible, such as implementations in which the input and output stages 91, 92 as are electrically powered using the same power supply.

The bipolar transistor 99 can include a base-collector junction that can have a capacitance that depends on the bias conditions of the transistor. Under large signal conditions, the base-collector junction can operate as a pumped varactor, and can oscillate at a frequency of about $f_o/2$, where $f_o$ is the frequency of the center of the amplified RF signal RF_OUT.

Under large signal conditions, the base of the bipolar transistor 99 can exhibit a negative input resistance, which can cause oscillations in the power amplifier system 100.

To aid in dampening oscillations, the dampening circuit 102 has been provided. The dampening circuit 102 includes the second or RF ballasting resistor 104, which has been disposed in series with the base of the bipolar transistor 99. Including the second resistor 104 can aid in making the collector-base varactor of the bipolar transistor 99 more linear, thereby limiting voltage variations at the collector. For example, the second resistor 104 can reduce the quality factor Q or de-Q the collector-base varactor the bipolar transistor 99. The dampening circuit 102 can further include the first or DC ballasting resistor 103 to further enhance stability of the power amplifier system 100 by increasing the impedance between the bias circuit 95 and the base of the bipolar transistor 99. In one implementation, the first resistor 103 has a resistance in the range of about 10Ω to about 100Ω, and the second resistor 104 has a resistance in the range of about 1.5Ω to about 2.5Ω.

Although particular resistance values of the first and second resistors 103, 104 have been provided above, the resistance of the first and second resistors 103, 104 can vary depending on a variety of factors, including, for example, a size of the bipolar transistor 99. For example, the resistance of the first and second resistors 103, 104 can be increased when the size of the bipolar transistor 99 is relatively small, and can be decreased when the size of the bipolar transistor 99 is relatively large. In one implementation, the values of the first and second resistors 103, 104 are scaled inversely with the size of the transistor 99.

In one embodiment, the second resistor 104 includes at least two resistive elements or fingers and the bipolar transistor 99 includes at least two transistor elements or fingers. Additionally, a first element of the second resistor 104 and a first element of the bipolar transistor 99 are electrically connected in series to form a first subcircuit, and a second element of the second resistor 104 and a second element of the bipolar transistor 99 are electrically connected in series to form a second subcircuit. Furthermore, the first and second subcircuits are electrically connected in parallel without electrically connecting the intermediate nodes of the first and second subcircuits to one another. Connecting the dampening circuit 102 to the bipolar transistor 99 in this manner can aid in reducing thermal runaway associated with heating of the bipolar transistor 99.

Figure 9A:
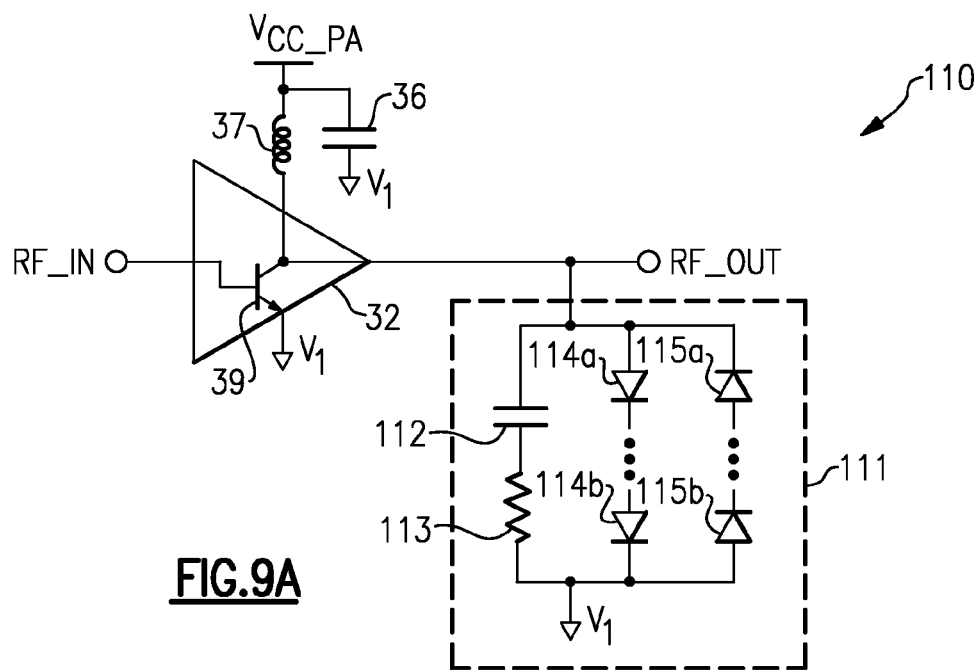
FIG. 9A is a schematic diagram of a power amplifier system according to yet another embodiment.

FIG. 9A is a schematic diagram of a power amplifier system 110 according to yet another embodiment. The power amplifier system 110 includes the power amplifier 32, the bypass capacitor 36, the inductor 37, and a limiting circuit 111.

The power amplifier 32 includes a bipolar transistor 39. The emitter of the bipolar transistor 39 can be electrically connected to a first supply voltage $V_1$, which can be, for example, a ground node. The base of the bipolar transistor 39 is configured to receive a RF signal RF_IN, and the collector of the bipolar transistor 39 is configured to generate an amplified RF signal RF_OUT. The inductor 37 is electrically connected between the power amplifier supply voltage $V_{CC\_PA}$ and the collector of the bipolar transistor 39, and the bypass capacitor 36 is electrically connected between the first supply voltage $V_1$ and the power amplifier supply voltage $V_{CC\_PA}$. Additional details of the power amplifier 32, the bypass capacitor 36, and the inductor 37 can be as described earlier.

The limiter circuit 111 includes a capacitor 112 and a resistor 113 electrically connected in series between the collector of the bipolar transistor 39 and the first supply voltage $V_1$. Additionally, the limiter circuit 111 includes a first diode 114a and a second diode 114b. The first diode 114a includes an anode electrically connected to the collector of the bipolar transistor 39 and a cathode electrically connected to an anode of the second diode 114b. Additionally, the second diode 114b further includes a cathode electrically connected to the first supply voltage $V_1$. The limiter circuit 111 further includes a third diode 115a and a fourth diode 115b. The third diode 115a includes a cathode electrically connected to the collector of the bipolar transistor 39 and an anode electrically connected to a cathode of the fourth diode 115b. Additionally, the fourth diode 115b further includes an anode electrically connected to the first supply voltage $V_1$. Although the first and second diodes 114a, 114b and the third and fourth diodes 115a, 115b are each shown as a stack of two diodes, more or fewer diodes can be stacked with the first and second diodes 114a, 114b and/or the third and fourth diodes 115a, 115b.

The limiter circuit 111 can reduce a rate of change of voltage or dV/dt at the output of the collector of the bipolar transistor 39, thereby limiting the operation of a pumped varactor formed from the base-collector junction of the bipolar transistor 39. As illustrated in FIG. 9A, limiter circuits can include, for example, one or more reverse-biased diodes electrically connected in series.

Figure 9B:
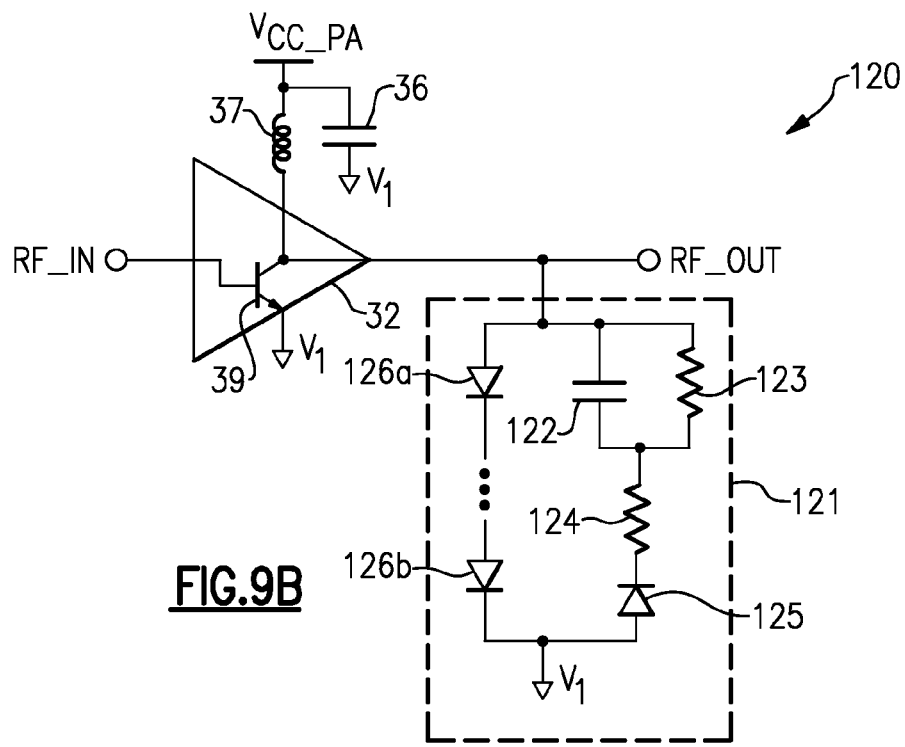
FIG. 9B is a schematic diagram of a power amplifier system according to yet another embodiment.

FIG. 9B is a schematic diagram of a power amplifier system 120 according to yet another embodiment. The power amplifier system 120 includes the power amplifier 32, the bypass capacitor 36, the inductor 37, and a limiting circuit 121. The power amplifier 32, the bypass capacitor 36, and the inductor 37 can be as described above with reference to FIG. 9A.

The limiter circuit 121 includes a capacitor 122, a first resistor 123, a second resistor 124, a first diode 125, a second diode 126a, and a third diode 126. The capacitor 122 includes a first end electrically connected to a first end of the first resistor 123 and to the collector of the bipolar transistor 39. Additionally, the capacitor 122 further includes a second end electrically connected to a second end of the first resistor 123 and to a first end of the second resistor 124. The second resistor 124 further includes a second end electrically connected to a cathode of the first diode 125. The first diode 125 further includes an anode electrically connected to the first supply voltage $V_1$. The second diode 126a includes an anode electrically connected to the collector of the bipolar transistor 39 and a cathode electrically connected to an anode of the third diode 126b. Additionally, the third diode 126b further includes a cathode electrically connected to the first supply voltage $V_1$. Although the second and third diodes 126a, 126b are illustrated as a stack of two diodes, more or fewer diodes can be stacked with the second and third diodes 126a, 126b.

Figure 10:
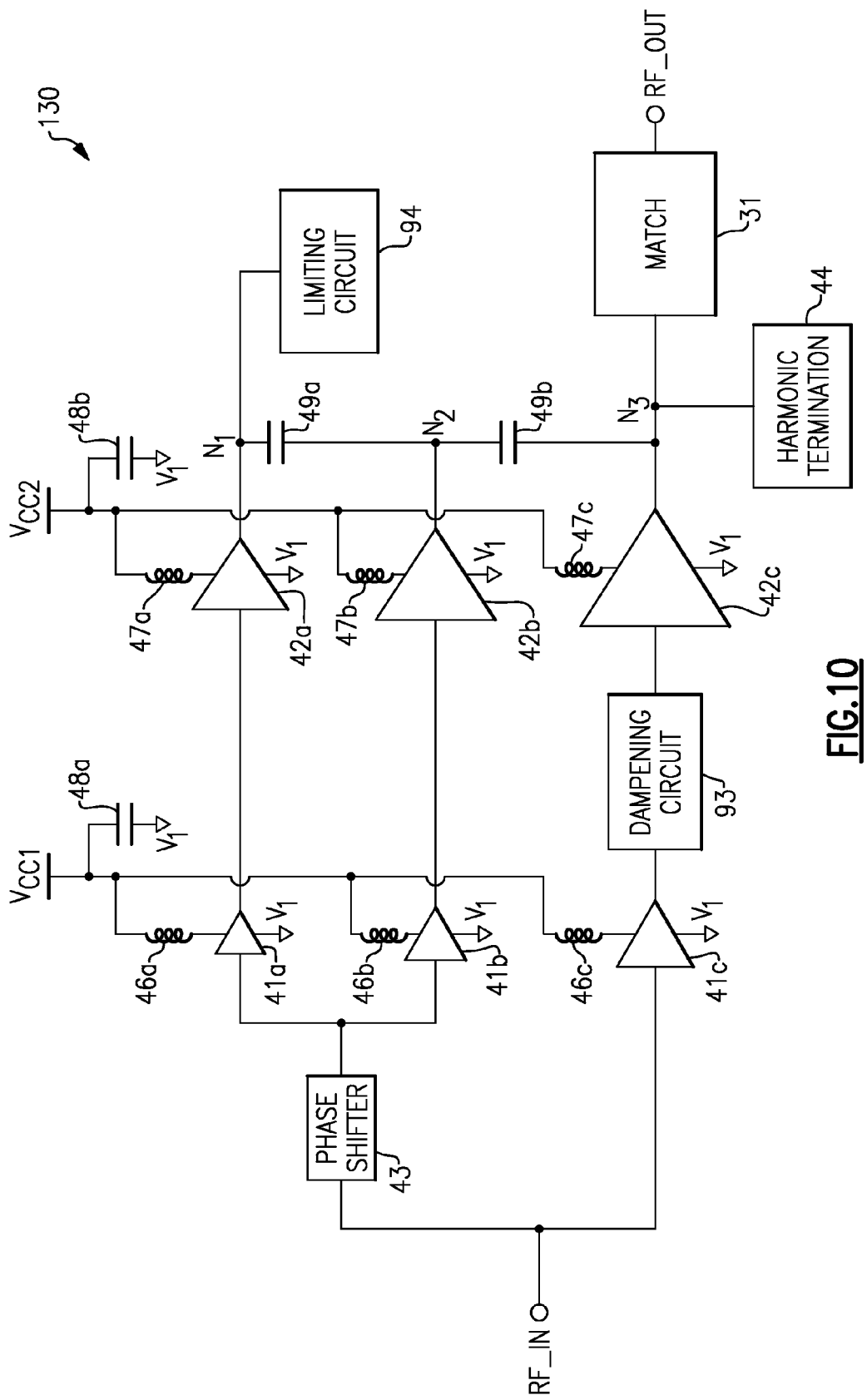
FIG. 10 is a schematic diagram of yet another embodiment of a power amplifier system.

FIG. 10 is a schematic diagram of yet another embodiment of a power amplifier system 130. The power amplifier system 130 includes the impedance matching block 31, the first to third input stages 41a-41c, the first to third output stages 42a-42c, the phase shifter 43, the harmonic termination block 44, the first to third input stage inductors 46a-46c, the first to third output stage inductors 47a-47c, the first decoupling capacitor 48a, the second decoupling capacitor 48b, the first impedance transformation capacitor 49a, the second impedance transformation capacitor 49b, the dampening circuit 93 and the limiting circuit 94.

The power amplifier system 130 of FIG. 10 can be similar to the power amplifier system 40 of FIG. 4A. However, in contrast to the power amplifier system 40 of FIG. 4A, the power amplifier system 130 further includes the limiting circuit 94 electrically connected to the output of the first output stage 42a and the dampening circuit 93 electrically connected between an output of the third input stage 41c and an input of the third output stage 42c.

Power amplifier stability can be a concern in a multi power amplifier system in which more than one power amplifier can be enabled at a time. For example, in the power amplifier system 130 of FIG. 10, the first to third output stages 42a-42c can be simultaneously operated in a high power mode of operation. The operation of a plurality of output stages can increase signal levels and further pump the varactors associated with transistors of the power amplifiers, thereby leading to instability. The problem can be exacerbated by varying VSWR.

Including the dampening circuit 93 at the input of the third output stage 42c and/or the limiting circuit at the output of the first output stage 42a can improve stability of the power amplifier system 130.

Although FIG. 10 illustrates the dampening circuit 93 at the input of the third output stage 42c, in certain implementations, additional dampening circuits can be included at the inputs of the first and/or second output stages 42a, 42b. In other implementations, the dampening circuit 93 is omitted at the input of the third output stage 42c in favor of using dampening circuits at the inputs of the first and/or second output stages 42a, 42b. Furthermore, in certain implementations, additional limiting circuits can be included at the outputs of the second and/or third output stages 42b, 42c, while in other implementations, the limiting circuit 94 is omitted at the output of the first output stage 42a in favor of using limiting circuits at the outputs of the second and/or third output stages 42b, 42c.

Applications

Some of the embodiments described above have provided examples in connection with mobile phones. However, the principles and advantages of the embodiments can be used for any other systems or apparatus that have needs for power amplifiers.

Such power amplifiers can be implemented in various electronic devices. Examples of the electronic devices can include, but are not limited to, consumer electronic products, parts of the consumer electronic products, electronic test equipment, etc. Examples of the electronic devices can also include, but are not limited to, memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. Further, the electronic devices can include unfinished products.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A method of amplifying an input radio frequency (RF) signal to generate an output RF signal, the method comprising:

generating a first amplified signal by amplifying the input RF signal using a first power amplifier;

generating a second amplified signal by amplifying the input RF signal using a second power amplifier, the second power amplifier including an output electrically connected to an output of the first power amplifier using a first capacitor, the second power amplifier having a power amplification greater than a power amplification of the first power amplifier;

generating a third amplified signal by amplifying the input RF signal using a third power amplifier, the third power amplifier including an output electrically connected to the output of the second power amplifier using a second capacitor, the third power amplifier having a power amplification greater than the power amplification of the second power amplifier;

combining the first, second and third amplified signals using the first and second capacitors to generate the output RF signal;

biasing the first power amplifier with a supply voltage using a first inductor;

biasing the second power amplifier with the supply voltage using a second inductor; and biasing the third power amplifier with the supply voltage using a third inductor.

2. The method of claim 1 further comprising using the second inductor and the second capacitor to transform a load line of impedance of the second power amplifier to be greater than a load line impedance of the third power amplifier.

3. The method of claim 2 further comprising using the first inductor and the first capacitor to transform a load line of impedance of the first power amplifier to be greater than the load line impedance of the second power amplifier.

4. The method of claim 1 further comprising suppressing an oscillation of the first power amplifier at a sub-harmonic of a fundamental frequency of the output RF signal using a first resonant circuit, the first resonant including a third capacitor electrically connected in parallel with the first inductor.

5. The method of claim 1 further comprising delaying the input RF signal to the first and second power amplifiers using a phase shifter so as to align the first, second and third amplified signals so that they combine in-phase.

6. The method of claim 1 further comprising using a first bipolar transistor to generate the first amplified signal, using a second bipolar transistor to generate the second amplified signal, and using a third bipolar transistor to generate the third amplified signal.

7. A method of amplifying an input radio frequency (RF) signal to generate an output RF signal, the method comprising:

generating a first amplified signal by amplifying the input RF signal using a first bipolar transistor of a first power amplifier;

generating a second amplified signal by amplifying the input RF signal using a second bipolar transistor of a second power amplifier, the second power amplifier including an output electrically connected to an output of the first power amplifier using a first capacitor;

generating a third amplified signal by amplifying the input RF signal using a third bipolar transistor of a third power amplifier, the third power amplifier including an output electrically connected to the output of the second power amplifier using a second capacitor;

combining the first, second and third amplified signals using the first and second capacitors to generate the output RF signal; and inhibiting a voltage change on the collector of the first bipolar transistor using a limiting circuit so as to prevent operation of the base and collector of the first bipolar transistor as a pumped varactor.

8. A method of amplifying an input radio frequency (RF) signal to generate an output RF signal, the method comprising:

generating a first amplified signal by amplifying the input RF signal using a first bipolar transistor of a first power amplifier;

generating a second amplified signal by amplifying the input RF signal using a second bipolar transistor of a second power amplifier, the second power amplifier including an output electrically connected to an output of the first power amplifier using a first capacitor;

generating a third amplified signal by amplifying the input RF signal using a third bipolar transistor of a third power amplifier, the third power amplifier including an output electrically connected to the output of the second power amplifier using a second capacitor;

combining the first, second and third amplified signals using the first and second capacitors to generate the output RF signal; and providing a resistor in series with the base of the third bipolar transistor, the resistor having a resistance selected to inhibit operation of the base and collector of the third bipolar transistor as a pumped varactor.

9. The method of claim 7 further comprising:

biasing the first power amplifier with a supply voltage using a first inductor;

biasing the second power amplifier with the supply voltage using a second inductor; and biasing the third power amplifier with the supply voltage using a third inductor.

10. The method of claim 9 further comprising using the second inductor and the second capacitor to transform a load line of impedance of the second power amplifier to be greater than a load line impedance of the third power amplifier.

11. The method of claim 10 further comprising using the first inductor and the first capacitor to transform a load line of impedance of the first power amplifier to be greater than the load line impedance of the second power amplifier.

12. The method of claim 9 further comprising suppressing an oscillation of the first power amplifier at a sub-harmonic of a fundamental frequency of the output RF signal using a first resonant circuit, the first resonant including a third capacitor electrically connected in parallel with the first inductor.

13. The method of claim 7 further comprising delaying the input RF signal to the first and second power amplifiers using a phase shifter so as to align the first, second and third amplified signals so that they combine in-phase.

14. The method of claim 7 wherein the second power amplifier has a power amplification greater than a power amplification of the first power amplifier and the third power amplifier has a power amplification greater than the power amplification of the second power amplifier.

15. The method of claim 8 further comprising:

biasing the first power amplifier with a supply voltage using a first inductor;

biasing the second power amplifier with the supply voltage using a second inductor; and biasing the third power amplifier with the supply voltage using a third inductor.

16. The method of claim 15 further comprising using the second inductor and the second capacitor to transform a load line of impedance of the second power amplifier to be greater than a load line impedance of the third power amplifier.

17. The method of claim 16 further comprising using the first inductor and the first capacitor to transform a load line of impedance of the first power amplifier to be greater than the load line impedance of the second power amplifier.

18. The method of claim 15 further comprising suppressing an oscillation of the first power amplifier at a sub-harmonic of a fundamental frequency of the output RF signal using a first resonant circuit, the first resonant including a third capacitor electrically connected in parallel with the first inductor.

19. The method of claim 8 further comprising delaying the input RF signal to the first and second power amplifiers using a phase shifter so as to align the first, second and third amplified signals so that they combine in-phase.

20. The method of claim 8 wherein the second power amplifier has a power amplification greater than a power amplification of the first power amplifier and the third power amplifier has a power amplification greater than the power amplification of the second power amplifier.

* * * * *